United States Patent
Hsieh et al.

(10) Patent No.: US 7,161,845 B2
(45) Date of Patent: Jan. 9, 2007

(54) STATIC RANDOM ACCESS MEMORY DEVICE HAVING A MEMORY CELL WITH MULTIPLE BIT-ELEMENTS

(75) Inventors: Chen-Hui Hsieh, Chu-Pei (TW); Kun Lung Chen, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 10/905,283

(22) Filed: Dec. 23, 2004

(65) Prior Publication Data

US 2006/0140014 A1   Jun. 29, 2006

(51) Int. Cl.
*G11C 7/10* (2006.01)

(52) U.S. Cl. .......................... 365/189.05; 365/189.03; 365/154; 257/E27.098

(58) Field of Classification Search ........... 365/189.03, 365/189.05, 154; 257/E27.098; 438/598
See application file for complete search history.

(56) References Cited

U.S. PATENT DOCUMENTS

| | | | |
|---|---|---|---|
| 4,864,544 A * | 9/1989 | Spak et al. ............ | 365/230.08 |
| 5,493,536 A * | 2/1996 | Aoki ..................... | 365/230.05 |
| 5,619,464 A | 4/1997 | Tran | |
| 6,005,793 A | 12/1999 | Tran | |
| 6,153,450 A * | 11/2000 | Deguchi ................. | 438/130 |
| 6,289,413 B1 | 9/2001 | Rogers et al. | |
| 6,424,882 B1 * | 7/2002 | Pierrat .................... | 700/121 |
| 6,664,810 B1 | 12/2003 | Pancholy et al. | |
| 6,711,086 B1 | 3/2004 | Terada | |
| 6,839,293 B1 * | 1/2005 | Kawamoto et al. ......... | 365/201 |
| 2004/0004298 A1 | 1/2004 | Madurawe | |

\* cited by examiner

*Primary Examiner*—Richard Elms
*Assistant Examiner*—Eric J. Wendler
(74) *Attorney, Agent, or Firm*—Baker & McKenzie LLP

(57) ABSTRACT

A memory cell for a static random access memory (SRAM) is disclosed that can be programmed to have a one-bit cell or a multi-bit cell (i.e, including two or more latches) according to a desired amount of cell current. For lower current needs, the memory cell can incorporate a single bit-element, while for higher current needs the memory cell can incorporate two or more bit-elements. An exemplary static random access memory device includes a memory cell having one or more bit-elements, such as bistable latches. Access devices, such as pass transistors, are coupled between each of the bit-elements and a bit line. A word line is coupled to the control terminal of each of the pass transistors for controlling communication between the bit-elements and the bit line.

23 Claims, 11 Drawing Sheets

STATIC RANDOM ACCESS MEMORY DEVICE HAVING A MEMORY CELL WITH MULTIPLE BIT-ELEMENTS

FIELD

The present invention relates semiconductor memory devices, and particularly relates to static random access memory (SRAM) devices.

BACKGROUND

Static random access memory (SRAM) is a type of semiconductor memory having an array of memory cells, where each memory cell stores one bit of information as a logic "1" state or a logic "0" state. In a conventional SRAM, each memory cell includes a one-bit memory element (bit-element), usually a bistable latch, that is capable of maintaining a logic state as long as power is maintained to the SRAM. SRAMs are widely used where high-speed memory is required, for example as high-speed cache memories in personal computers.

In conventional memory cell arrays, data is read out from a specified memory cell by activating a corresponding word line, and then discharging a voltage from the selected memory cell through a corresponding bit line to a read circuit. This operation is ultimately limited by the amount of current that can pass through the memory cell, where higher currents afford greater speeds. However, efforts to improve memory density have resulted in a reduction of the scale of bit-elements in the memory cells. The smaller memory cell structures require that the bit cell discharge current be reduced, consequently resulting in a reduction in bit-line discharge speed. Thus, memory access speed is adversely affected by reduction in the size of memory cell array components.

SUMMARY

As described herein, a single bit-element architecture can be qualified and then used for fulfillment of a variety of product specifications. For example, a bit-element architecture can be designed and qualified for production, then used for a variety of cell current or memory access speed requirements. This can be accomplished by implementing the qualified bit-element as part of a single bit-element memory cell or as part of a multi-bit-element memory cell (e.g, including two or more latches) according to a desired current level. For lower current needs, a memory cell can include only a single bit-element. However, if a higher current is needed, for example in order to increase memory access speed, a memory cell can include two or more of the qualified bit-elements (e.g, double, triple, quadruple, etc.). Increasing the number of bit-elements allows for the bit-line current to be increased, since it can be divided among the multiple bit-elements. Thus, the allowable bit-line current can be increased, so the memory access speed can be increased as well. Since multiple instances of the single qualified bit-element is used, there is no need for designing and qualifying a new or custom bit-elements or memory cells for each different cell-current or memory access speed requirement.

A static random access memory device described in this application can include a memory cell that can be configured to include one or more bit-elements (e.g, latches). Multiple bit-elements can be accessed via access devices, such as pass transistors, that are coupled between each of the bit elements and a bit line. One or more word lines can be coupled to the control terminal of each of the pass transistors for controlling concurrent communication between the bit elements and the bit line. A single bit of information can be stored by activating the word line, which allows simultaneous access to each of the multiple bit-elements. Specifically, when the word line(s) activates the pass transistors, the current from the bit lines is divided among the multiple bit elements. This allows for a higher bit-line current than any one bit-element could handle alone.

In some embodiments, a single word line can be used to activate a plurality of bit-elements allowing for current division between the bit-elements. In other embodiments, multiple word lines can be activated concurrently, which in turn causes concurrent activation of multiple bit-elements in order to allow for current division between the multiple bit-elements. In some embodiments, multiple word lines can be concurrently activated by connecting the multiple word lines directly, for example with a conductive line. In some embodiments, multiple word lines can be concurrently activated by a row select device.

According to the principles and concepts disclosed herein, a memory device can be provided with multiple bit-elements that are concurrently activated or not according to selection of an appropriate mask option during fabrication. For example, a first mask option can provide for fabrication of conductive lines that connect pairs of word lines such that the pair of word lines will concurrently activate pairs of bit-elements, while a second mask option leaves word lines isolated from each other such that bit-elements are independently activated. Alternate mask options can be used for connecting groups of any number of word lines. Alternately, a memory device can be fabricated such that connections between word lines are selectable post-fabrication, for example such that the memory device is programmable by using fusible links.

In some embodiments, mask options can be used for altering the way in which a row select device activates word lines. For example, a first mask option can result in the row select device activating word lines in pairs, while a second mask option can result in the row select device activating word lines one at a time. Alternate mask options can result in the row select device activating any number of word lines in groups. Alternately, the row select device can be programmable post-fabrication, for example using fusible links, to concurrently activate a selectable number of word lines.

BRIEF DESCRIPTION OF THE DRAWINGS

The present invention is illustrated by way of example and is not limited by the figures of the accompanying drawings, in which like reference numbers indicate similar parts.

DETAILED DESCRIPTION OF THE INVENTION

Figure 1:
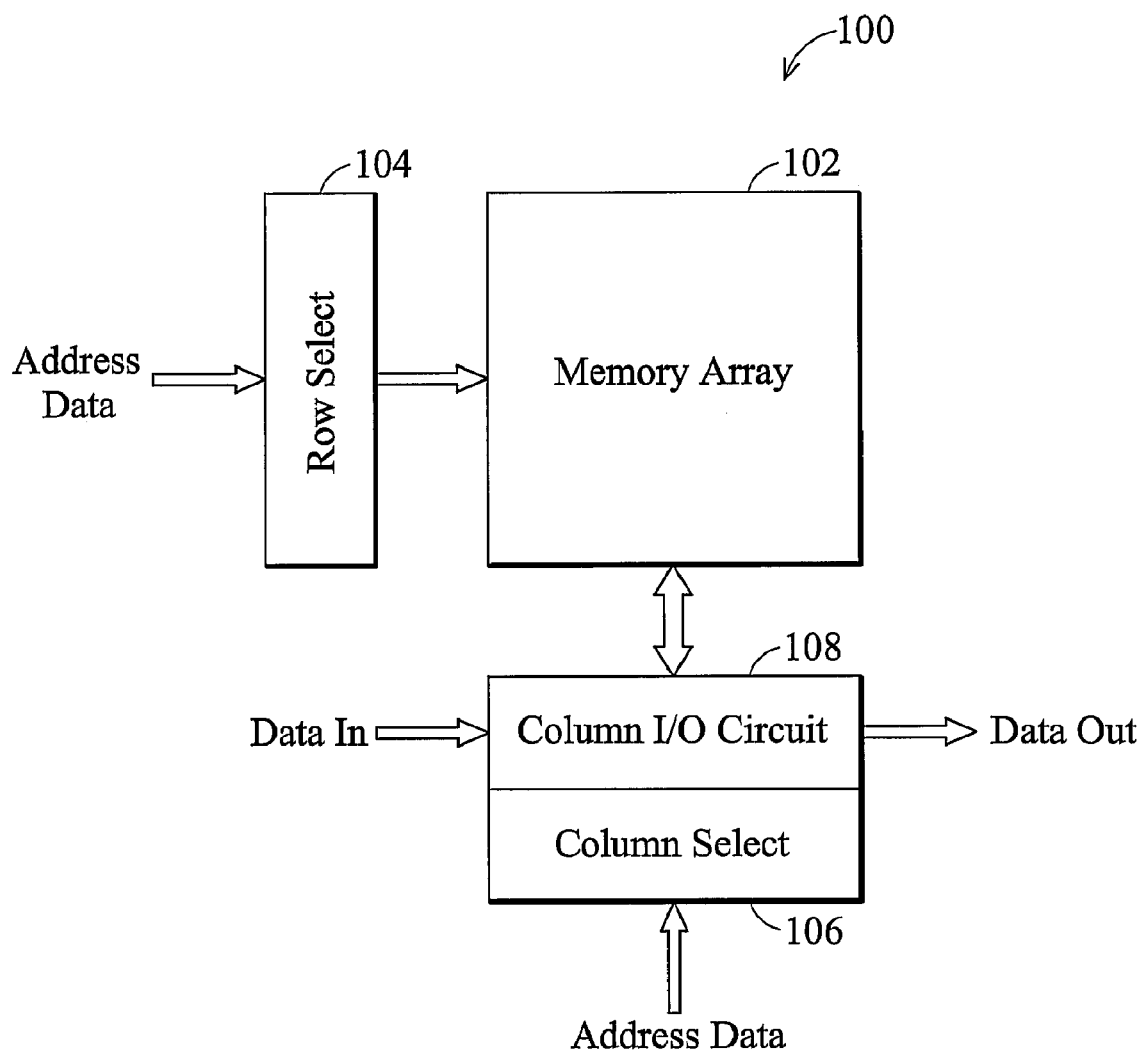
FIG. 1 shows a block diagram of a static random access memory device.

FIG. 1 shows a block diagram of an SRAM 100, illustrating an example of memory organization on a chip. The SRAM 100 comprises a memory array 102 in which a plurality of memory cells are arrayed in rows and columns. Address data input to a row select device 104 and a column select device 106 is used to select a row and column in the array 102. The memory cell at the intersection of the selected row and column is connected to the I/O circuit 108. For a read operation, data from a selected memory cell is output via the I/O circuit 108, while for a write operation data is input via to the I/O circuit 108 to be transferred to a selected memory cell.

Figure 2A:
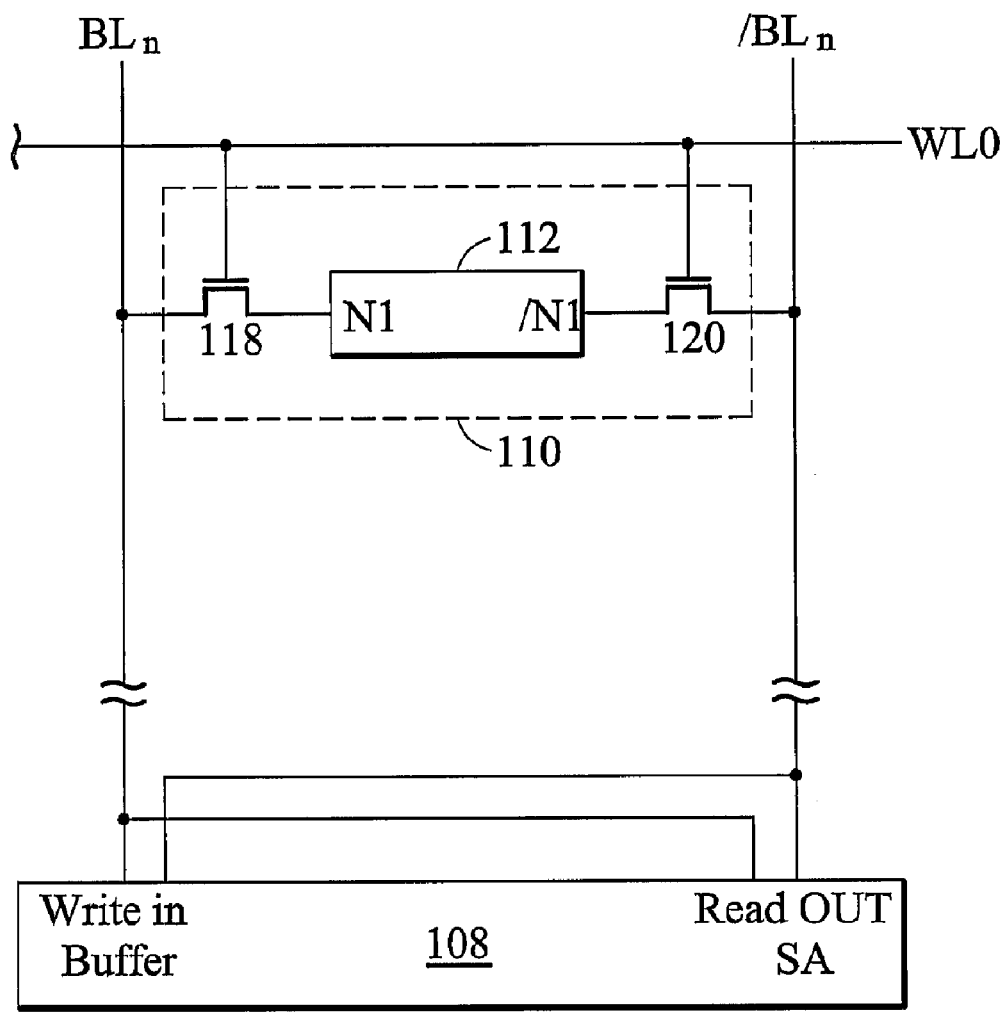
FIG. 2A shows a schematic diagram of a first example of a single-port SRAM memory cell.

FIG. 2A shows an embodiment of an SRAM memory cell 110 suitable for use in the memory array 102. The memory cell 110 includes a latch 112, which serves as a bistable bit-element for storing a bit of binary data. The latch 112 comprises a true node N1 (positive) and a complement node/N1 (negative). The nodes N1 and /N1 are each capable of maintaining (i.e, storing) either a logic "0" state or a logic "1" state, where the node /N1 stores the complement of the state stored at node N1. True bit line BLn and complement bit line /BLn, which serve as communication lines, can access the latch 112 via a pair of access devices (pass transistors) 118 and 120 for reading and/or writing to the latch 112. The transistors 118 and 120 are controlled by a word line WL0, which serves as an address line for selecting a row of memory cells. The word line WL0 can control communication between the latch 112 and the bit lines BLn and /BLn. Specifically, the word line WL0 is coupled with the control lines (e.g, gates) of transistors 118 and 120, so when the word line WL0 is energized, the transistors 118 and 120 are turned on and allow the bit lines BLn and /BLn to write to or read from the latch 112.

Figure 2B:
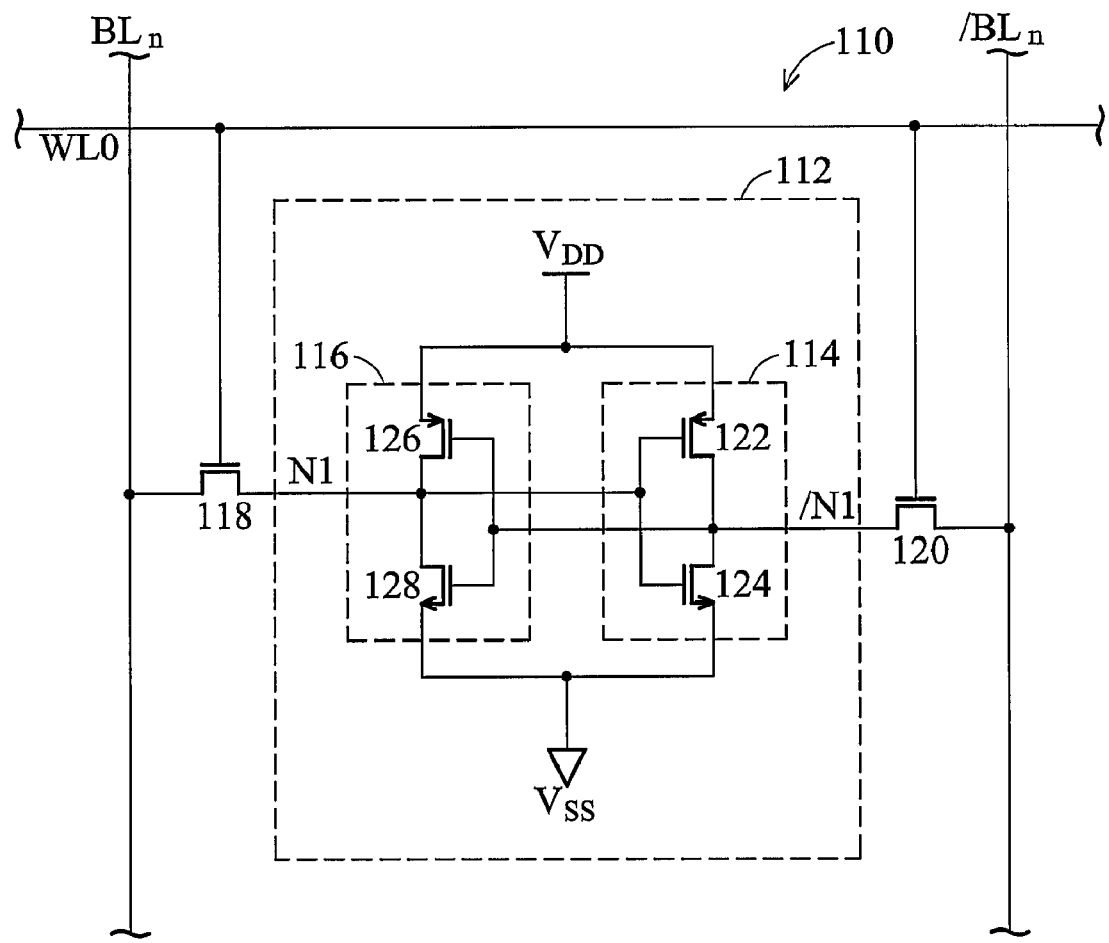
FIG. 2B shows a schematic diagram of an example of a latch that can be used in an SRAM memory cell.

As shown in FIG. 2B, the latch 112 can include a pair of inverters 114 and 116, for example Complementary Metal-Oxide Semiconductor (CMOS) inverters. The inverter 114 includes a p-channel device (PMOS) 122 and an n-channel device (NMOS) 124 connected drain-to-drain; the inverter 116 also includes a PMOS device 126 and an NMOS device 128 connected drain-to-drain. The sources of the PMOS devices 122, 126 are both connected to $V_{DD}$, which supplies a dc voltage. The sources of the NMOS devices 124, 128 are both connected to $V_{SS}$, which can be ground or a dc voltage that is less than $V_{DD}$. The gates of PMOS device 122 and NMOS device 124 are coupled together at the input of inverter 114, while the drains of PMOS device 122 and NMOS device 123 are coupled together at the output of inverter 114. Likewise, the input of inverter 116 is at a connection of the gates of PMOS device 126 and NMOS device 128, and the output is at a connection of the drains of PMOS device 126 and NMOS device 128. Thus, node N1 is connected to the input of inverter 114 and the output of inverter 116, while node /N1 is connected to the input of inverter 116 and the output of inverter 114. It will be appreciated that alternate arrangements and components for the latch 112 can be used.

During a read operation, the bit lines are precharged to $V_{DD}$, and then word line WL0 is energized, turning on pass transistors 118 and 120. If, for example, the memory cell 110 is storing a logic "0" state, the node N1 will be set to "0" and the node /N1 will be set at "1". This also means that NMOS device 124 is off and NMOS device 128 is on. Once the transistors 118 and 120 are turned on, the bit line BLn will be pulled LOW to Vss through NMOS device 128, and the bit line /BLn will remain HIGH at approximately $V_{DD}$ since PMOS device 122 is on and NMOS device 124 is off.

During a write operation, the I/O circuitry gates a value, for example logic "1" state, to the data lines for a column corresponding to bit lines BLn and /BLn. In other words, bit line BLn is driven high and bit line /BLn is set low. The row select device 104 energizes word line WL0, which turns on pass transistors 118 and 120. Once transistors 118 and 120 are on, bit line /BLn will pull node /N1 down, turning off NMOS device 128 if it is on, and leaving it off if it had been in that state. Bit line BLn will pull node N1 up, turning on NMOS device 124 if it is off and leaving it on if it had been in that state. Thus, the latch 102 is left with NMOS device 124 on and NMOS device 128 off, which represents the logic "1" state for the memory cell 110.

The time required by the cell transistors to charge and discharge the capacitance of the bit lines BLn and /BLn constitutes much of the access time of the SRAM. The speed at which the charge and discharge can occur is related to the level of charge/discharge current. In general, a higher current yields greater speed. However, the current level is bound by the physical limitations imposed by the structure of the memory cell components. As the size of memory cells is reduced, the current must likewise be reduced, which means slower access speeds. On the other hand, smaller memory cell structures are desirable to provide increased memory density and/or reduced power consumption. Nevertheless, for some applications access speed can be a higher priority. In the past, a need for increased access speed could be addressed by designing a custom memory cell or peripheral circuitry. However, such new or custom designs require extensive time and expense to design and test before they can be released for production.

In order to avoid the expense and effort associated with custom designs, the memory cells disclosed herein can be rearranged or reprogrammed to couple two or more latches per memory cell to a single word line. Other options include reprogramming the row select device 104 to simultaneously activate pairs or groups of word lines, as discussed below.

Figure 2C:
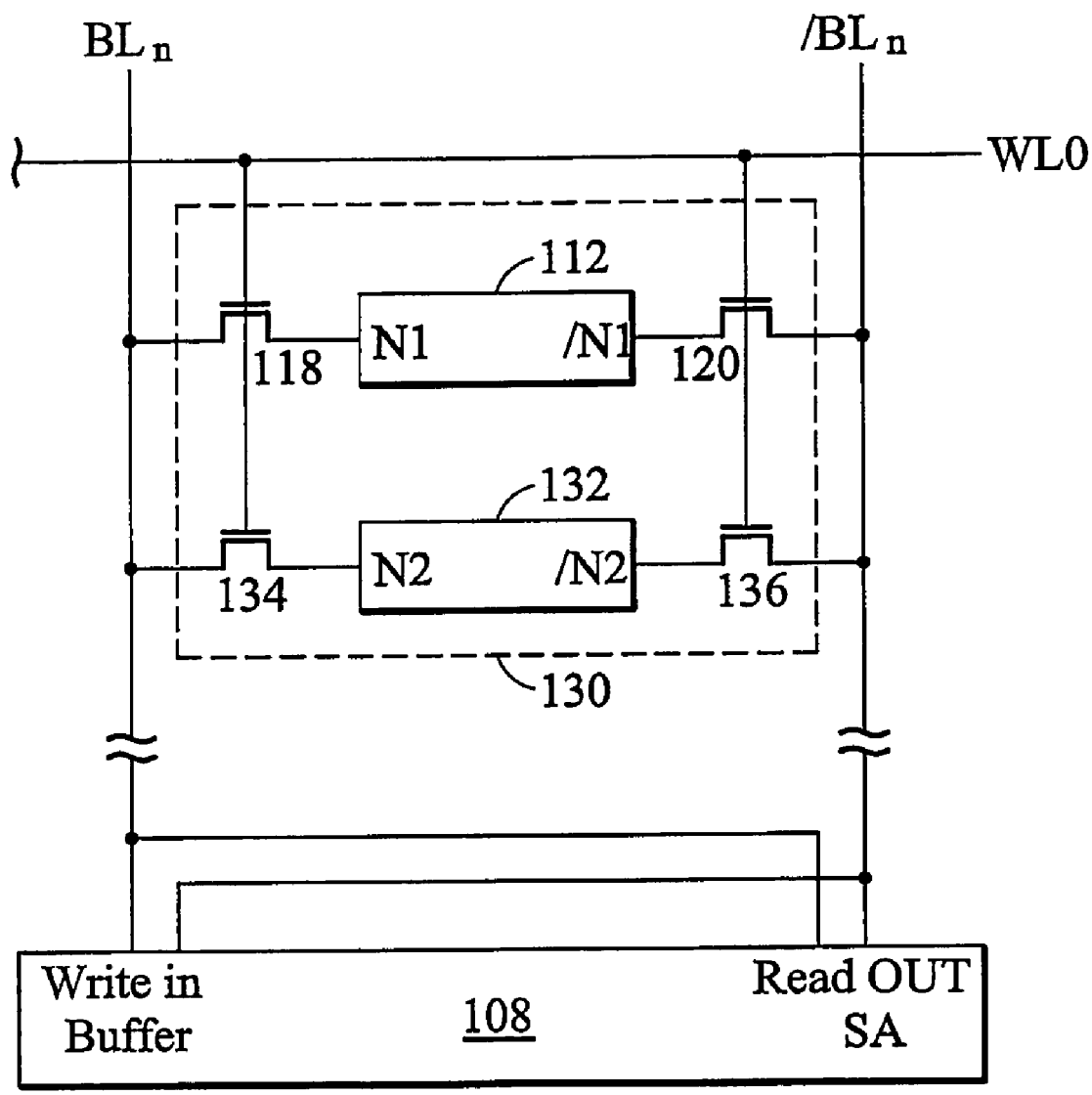
FIGS. 2C–2D show a schematic diagrams of second and third examples of a single-port SRAM memory cell.

FIG. 2C shows an example where two latches are connected to a single word line, thereby compounding the memory cell 110 to form a double bit-element memory cell 130. By compounding single-bit or single-latch cells into multiple bit-element or multi-latch cells, a memory cell can be altered to vary the sustainable current level thereof, and therefore the access speed of the memory cell without the need for designing and qualifying a new memory cell design. In the memory cell 130, all of the same components (112–120) are present from memory cell 110, plus an extra set of such components (132–140) is added to form a double bit-element memory cell 130. The added components include a second latch 132 and a second pair of pass transistors 134 and 136. The control lines of pass transistors 134 and 136 are coupled with word line WL0 along with the control lines of pass transistors 118 and 120. This way, when the word line WL0 is energized all four of the pass transistors 118, 120, 134, and 136 are turned on. The pass transistors 134 and 136 then allow access from bit lines BLn and /BLn, respectively, to the second latch 132 simultaneously with the action of pass transistors 118 and 120 allowing access from the same bit lines BLn and /BLn, respectively, to the latch 112. As a result, the bit-line current is divided between the two latches 112 and 132 according to Kirchoff's Law. Thus, the bit-line current can be approximately twice that which would normally be acceptable for only a single latch, so overall memory cell access speed is increased.

Figure 2D:
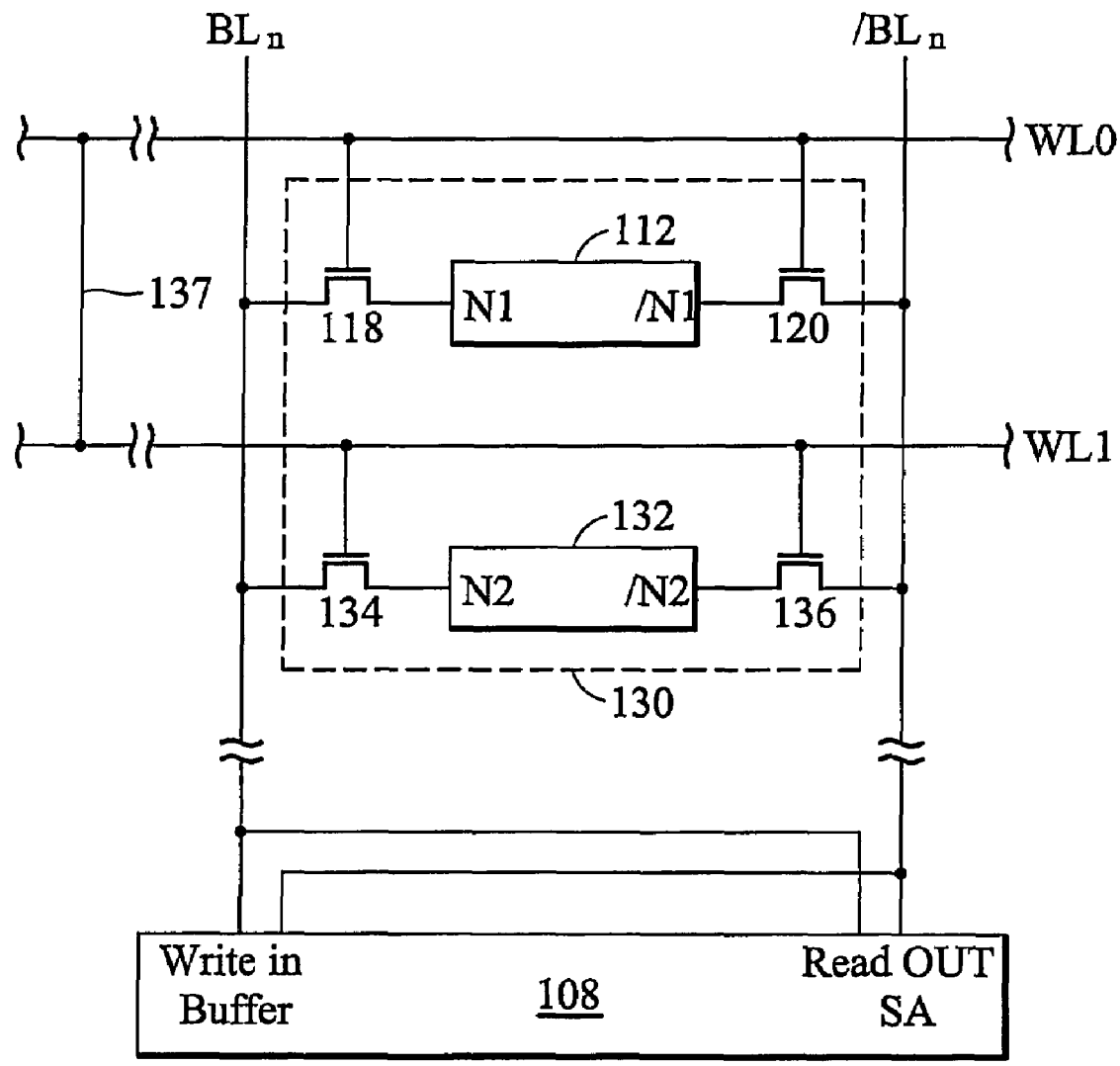

FIG. 2D shows another example where two latches are connected. However, unlike the example in FIG. 2C where two latches are connected to a single word line, in FIG. 2D two latches are connected to respective word lines that are connected. Specifically, a first latch 112 is connected to a first word line WL0 via transistors 118 and 120, and a second latch 132 is connected to a second word line WL1 via transistors 134 and 136. The first and second word lines WL0 and WL1 are connected via conductive line 137 so that they will be concurrently activated. Thus, the two word lines WL0 and WL1 can be considered a single word line at least from a functional standpoint. As a result, the bit-line current will be divided between the two latches 112 and 132. Thus, as discussed above in connection with FIG. 2C, the bit-line current can be approximately twice that which would normally be acceptable for only a single latch, so overall memory cell access speed is increased.

Figure 3:
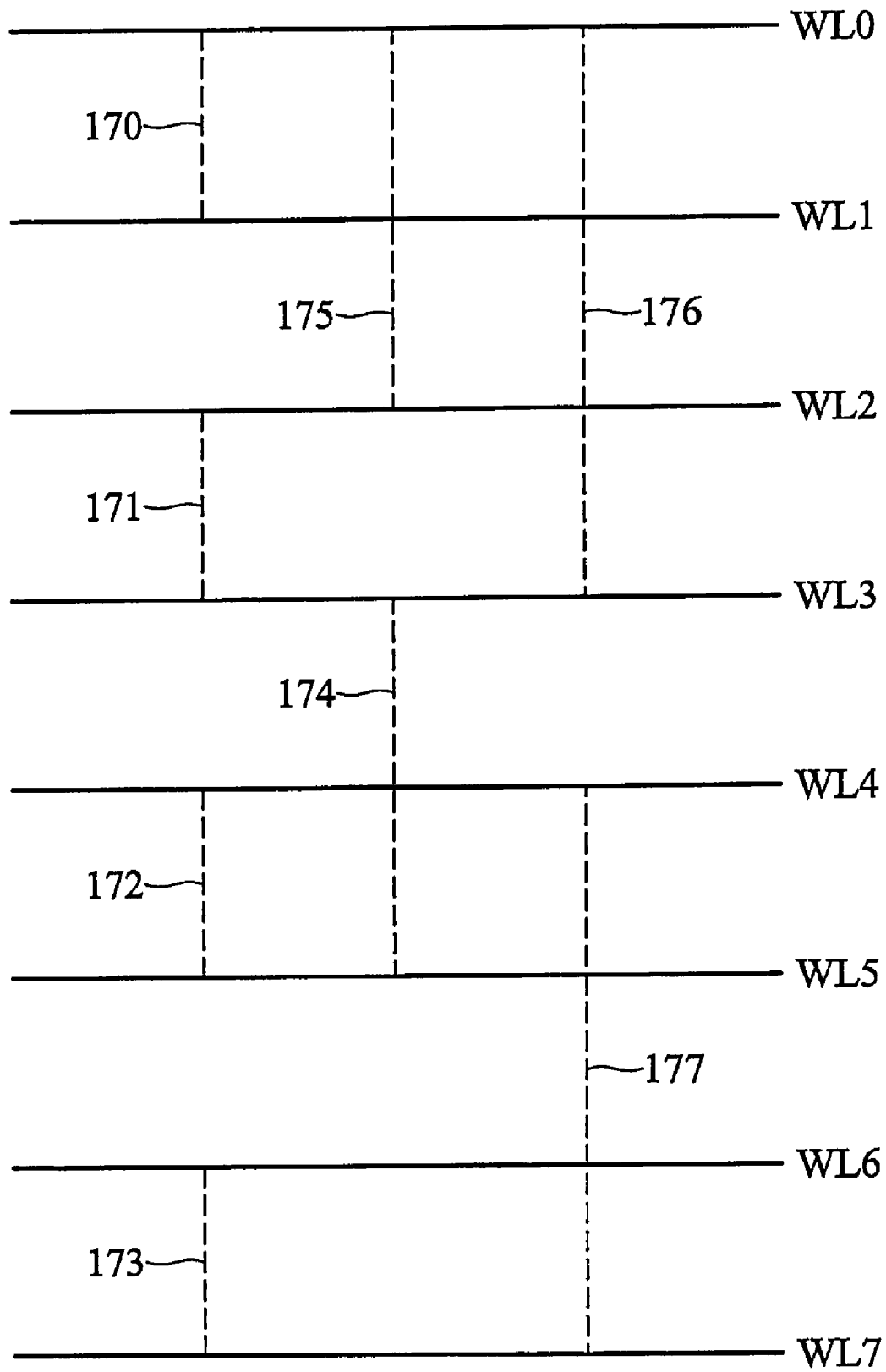
FIG. 3 shows examples of word line connections in an SRAM memory array.

It will be appreciated that additional pairs of latches can be connected, and additional numbers of latches can be connected. For example, FIG. 3 shows three different options for connecting word lines in an eight-word-line memory. A first option is to connect pairs of word lines using conductive lines 170–173, shown as dashed lines, which is an option that corresponds to the example shown in FIG. 2D. Specifically, conductive line 170 connects word lines WL0 and WL1, conductive line 171 connects word lines WL2 and WL3, conductive line 172 connects word lines WL4 and WL5, and conductive line 173 connects word lines WL6 and WL7. This option allows for twice the normal bit-line current to be used. A second option is to connect word lines in groups of three using conductive lines 174 and 175, shown as dash-dot-dash lines. Specifically, conductive line 174 connects word lines WL0, WL1, and WL2, and conductive line 175 connects word lines WL3, WL4, and WL5. This option allows for three times the normal bit-line current to be used. A third option is to connect word lines in groups of four using conductive lines 176 and 177, shown as dash-dot-dot-dash lines. Specifically, conductive line 176 connects word lines WL0, WL1, WL2, and WL3, and conductive line 177 connects word lines WL4, WL5, WL6, and WL7. This option allows for four times the normal bit-line current to be used. The conductive lines 170–177 can be formed anywhere along the word lines, including in the row select 104, and/or in the memory array 102. The conductive lines 170–177 can be formed during fabrication, for example using mask options. Alternately, the conductive lines 170–177 can be programmable post-fabrication, for example by using fusible links.

Memory cell arrays described herein can use multiple bit-elements (double, triple, quadruple, etc.) connected in a one-bit cell scheme to provide multiple-bit cell current for improved read-out speed. Additionally, the cell current can be varied according to varying desired requirements. For example, if a 45 uA memory cell is desired, a unit cell (25 uA cell current) can be used in a double bit-element arrangement (two unit cells) to achieve 50 uA cell current. If desired, a quadruple bit-element arrangement (four unit cells) can be used to achieve 100 uA cell current for ultra-high cell current in ultra-high-speed applications. Thus, the memory cell disclosed herein advantageously allows for a single memory cell design to fulfill a variety of design requirements.

Figure 4A:
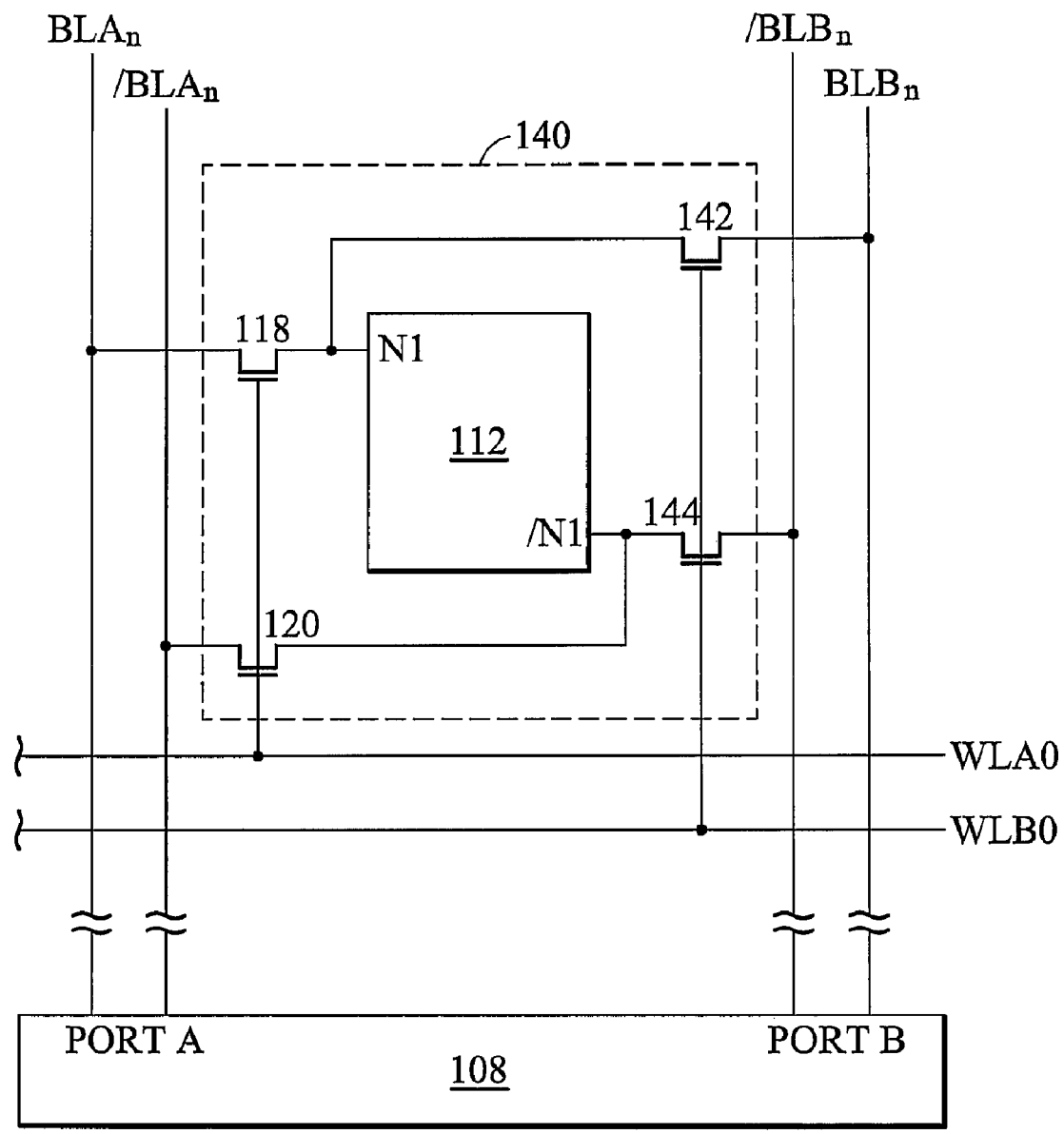
FIGS. 4A–4C show schematic diagrams of examples of double-port SRAM memory cells.

FIG. 4A shows an alternate embodiment, where the memory cell is embodied as a dual port (DP) SRAM memory cell 140. Several components of the memory cell 140 are like those of memory cells 110 and 130, so descriptions thereof are not repeated here. The thing to note is that, instead of a single word line WL0, there are two word lines WLA0 and WLB0, and instead of a single pair of bit lines BLn and /BLn, there are two pairs of bit lines BLAn, /BLAn and BLBn, /BLBn. Each word line and pair of bit lines corresponds to a respective one of ports A and B. There are also additional access devices (pass transistors) 142 and 144 that provide access to the latch 112 from the extra pair of bit lines BLBn and /BLBn. This embodiment allows two ports to operate simultaneously, each using a respective word line, pair of pass transistors, and pair of bit lines. Since two ports can operate simultaneously, the dual port SRAM devices allows twice the transfer rate during operation compared with the single port SRAM.

Figure 4B:
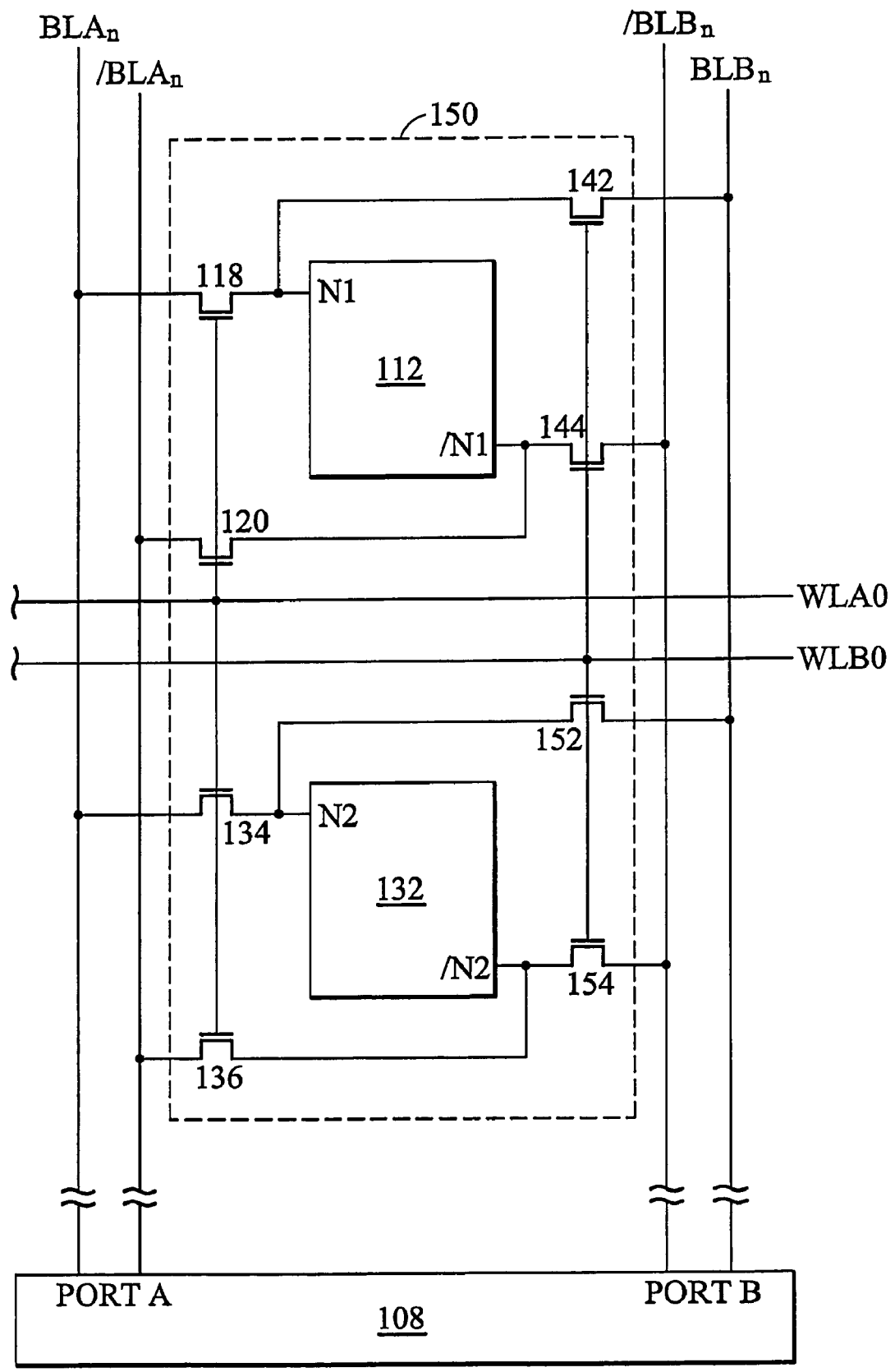

FIG. 4B shows an example where the dual port memory cell 140 has been compounded to form a double bit-element dual port memory cell 150. The memory cell 150 includes all of the same components included in memory cell 140, and adds a second of each of those components, including a second latch 132 having inverters 134 and 136 and additional pairs of pass transistors 134, 136 and 152, 154. Each of the two word lines WLA0 and WLB0 is coupled to a pair of pass transistors for each latch. Specifically, word line WLA0 is coupled to the gates of pass transistors 118, 120 and 134, 136, while word line WLB0 is coupled to the gates of pass transistors 142, 144 and 152, 154. Thus, when the word line WLA0 is energized all four of the pass transistors 118, 120, 134, and 136 are turned on, and when word line WLB0 is energized all four of the pass transistors 142, 144, 152, and 154 are turned on. The pass transistors 118 and 120 control access from bit lines BLAn and /BLAn, respectively, to the first latch 112 simultaneously with the action of pass transistors 134 and 136 controlling access from the same bit lines BLAn and /BLAn, respectively, to the second latch 132. As a result, the bit-line current from bit lines BLAn and /BLAn is divided between the two latches 112 and 132. Similarly, the pass transistors 142 and 144 control access from bit lines BLBn and /BLBn, respectively, to the first latch 112 simultaneously with the action of pass transistors 152 and 154 controlling access from the same bit lines BLBn and /BLBn, respectively, to the second latch 132. As a result, the bit-line current from bit lines BLBn and /BLBn is divided between the two latches 112 and 132. Thus, the bit-line current can be approximately twice that which would normally be acceptable for only a single latch, so overall memory cell access speed is increased.

Figure 4C:
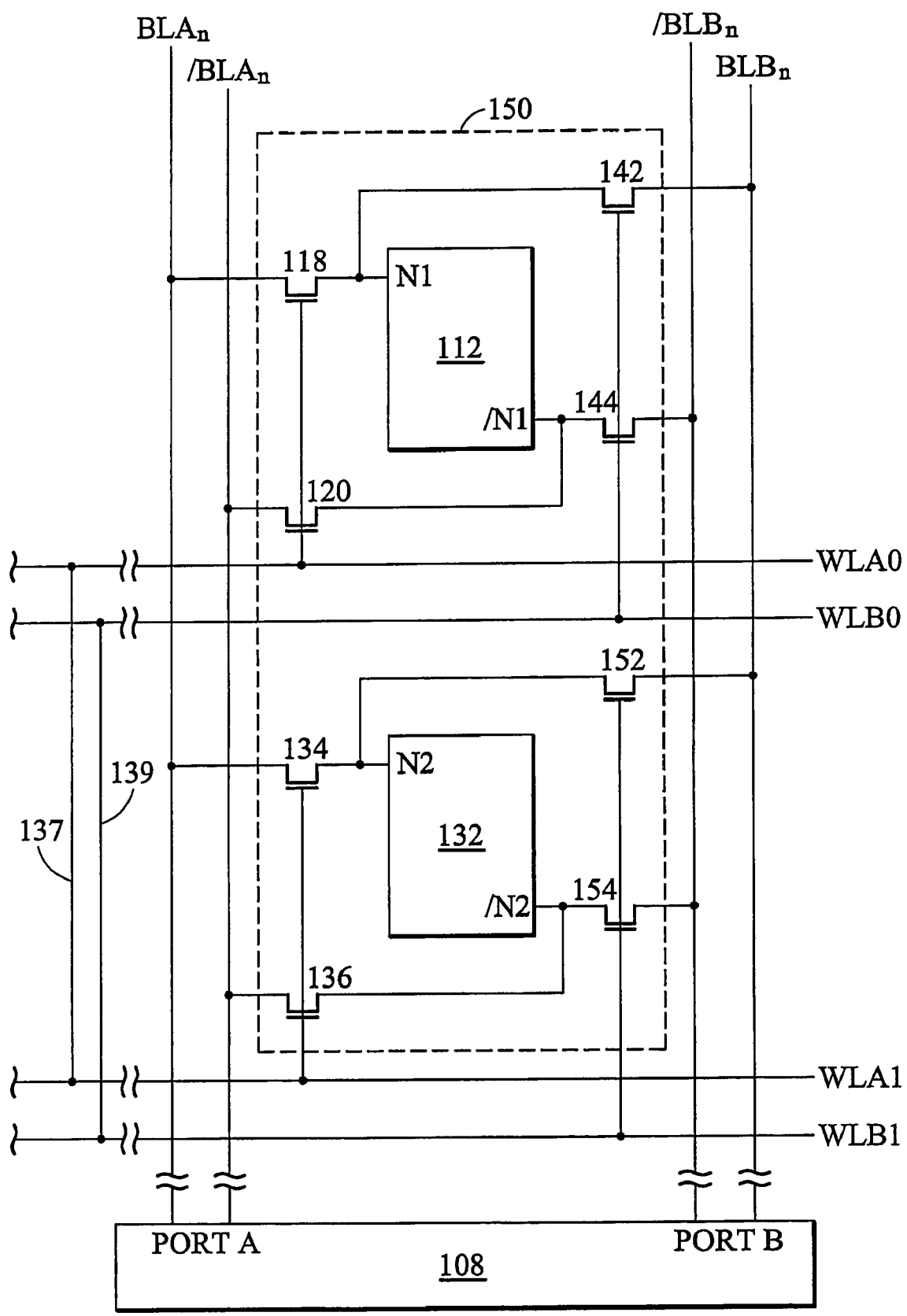

FIG. 4C shows another example where two latches are connected in a dual port memory cell. However, unlike the example in FIG. 4B where two latches are connected to a single pair of word lines, in FIG. 4C two latches are connected to respective pairs of word lines that are connected. Specifically, a first latch 112 is connected to a first pair of word lines WLA0 and WLB0, and a second latch 132 is connected to a second pair of word lines WLA1 and WLB1. Word lines WLA0 and WLB0 are connected to word lines WLA1 and WLB1, respectively. Word line WLA0 is connected to word line WLA1 via conductive line 137, and word line WLB0 is connected to word line WLB1 via conductive line 139. Thus, word lines WLA0 and WLA1 will be concurrently activated, and word lines WLB0 and WLB1 will be concurrently activated. Accordingly, the two word lines WLA0 and WLA1 can be considered a single word line and the two word lines WLB0 and WLB1 can be considered a single word line. As a result, the bit-line currents will be divided between the two latches 112 and 132, allowing for increased bit-line current and increased access speed.

Figure 5:
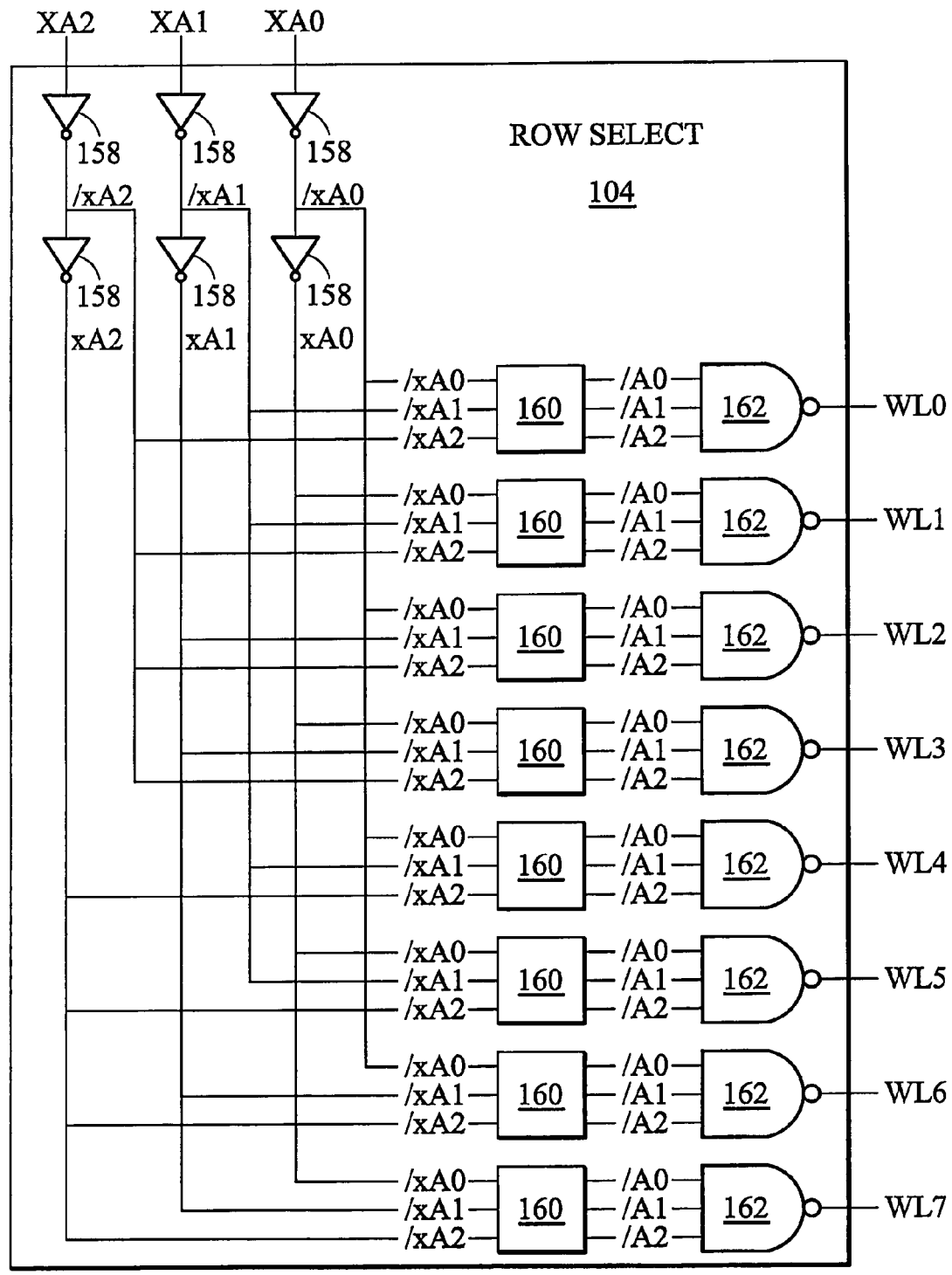
FIG. 5 shows a schematic diagram of an example of a row select device.

FIG. 5 shows an embodiment of a row select device 104. The row select device 104 is a 3-to-8 decoder, having three binary inputs XA0, XA1, XA2 and eight outputs WL0 through WL7 corresponding to respective word lines. The row select device includes six inverters 158 for providing inverted input signals /xA0, /xA1, and /xA2 and double-inverted input signals xA0, xA1, and xA2. The signals /xA0–/xA2 and xA0–xA2 are supplied to NAND circuits 162 as shown in order to cause a different one of the word lines WL0–WL7 to be activated for each of the eight possible different inputs (e.g, 000-111). The row select device 104 also includes an option block 160 for each of the NAND circuits 162. The option blocks 160 allow for the connections between the inverters 158 and the NAND circuits 162 to be altered.

Figure 6A:
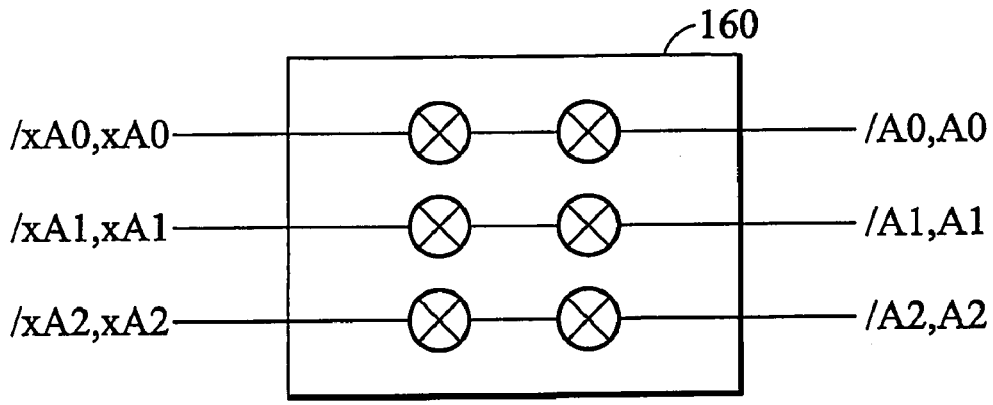
FIGS. 6A–6C show schematic diagrams of connection options in the row select device shown in FIG. 5.
Figure 6B:
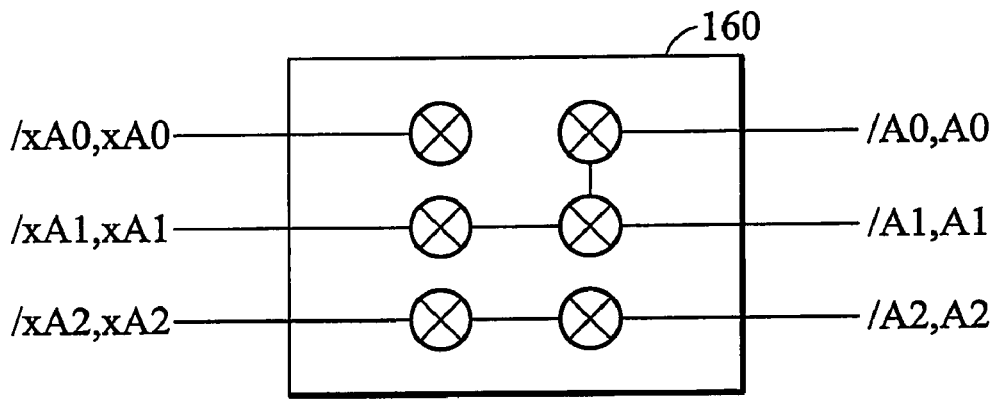
Figure 6C:
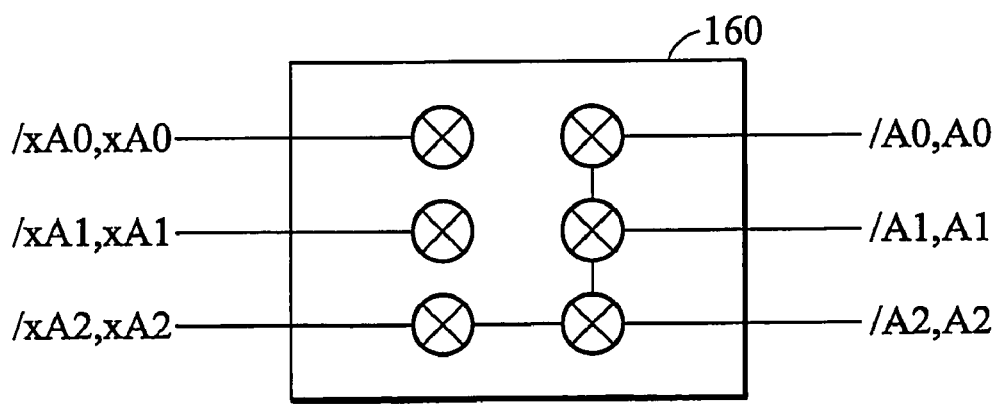

FIGS. 6A–6C show examples of different connection arrangements that can be implemented in the option block 160. Any one of the option blocks 160 shown in FIGS. 6A–6C can be implemented in the row device 104 during fabrication, for example by using mask options. Alternately, the different arrangements shown in FIGS. 6A–6C can be selectable arrangements that can be selected post-fabrication, for example by using fusible links. It will be appreciated that alternate embodiments of the row select device can include alternate logic designs for any number of inputs and outputs, including pre-decoder arrangements and word-line driver circuitry for boosting the signal level of the word lines.

In a first arrangement shown in FIG. 6A, the option block 160 is configured to provide an output for each input. In this configuration, the row select device 104 operates as a 3-to-8 decoder that activates only one of the word lines WL0–WL1 for each of the eight possible inputs 000-111.

In a second arrangement shown in FIG. 6B, the option block 160 disconnects the input for /xA0 or xA0, and connects the input for /xA1, xA1 to the outputs for /A0, A0 and /A1, A1. In this configuration, the row select device 104 activates the word lines WL0–WL7 in pairs. Specifically, the row select device 104 operates according to the truth table shown in Table 1 below. Note that the input level for input XA0 is designated "x" because it is disconnected and has no impact on which word line is activated. Since the word lines WL0–WL7 are activated two at a time, pairs of latches are activated in the same manner as described above in connection with FIG. 2D. This second arrangement of the option block 160 can be used with or without the conductive lines 170–173 shown in FIG. 3.

TABLE 1

| Input | | | |
|---|---|---|---|
| XA2 | XA1 | XA0 | Activated Word Lines |
| 0 | 0 | x | WL0 and WL1 |
| 0 | 1 | x | WL2 and WL3 |
| 1 | 0 | x | WL3 and WL5 |
| 1 | 1 | x | WL6 and WL7 |

In a third arrangement shown in FIG. 6C, the option block 160 disconnects the inputs for /xA0,xA0 and /xA1,xA1, and connects the input for /xA2, xA2 to the all of the outputs /A0, A0; /A1, A1; and /A2, A2. In this configuration, the row select device 104 activates the word lines WL0–WL7 in groups of four. Specifically, the row select device 104 operates according to the truth table shown in Table 2 below. Note that the input levels for inputs XA0 and XA1 are designated "x" because they are disconnected and have no impact on which word lines are activated. Since the word lines WL0–WL7 are activated four at a time, four latches are activated at a time, allowing for a bit-line current that is four times the bit-line current used for a single latch. This third arrangement of the option block 160 can be used with or without the conductive lines 176 and 177 shown in FIG. 3.

TABLE 2

| Input | | | |
|---|---|---|---|
| XA2 | XA1 | XA0 | Activated Word Lines |
| 0 | x | x | WL0, WL1, WL2, and WL3 |
| 1 | x | x | WL4, WL5, WL6, and WL7 |

In another embodiment of the row select device 104, additional circuitry can be provided for supporting dual-port memory cells. Alternately, a pair of row select devices 104 can be used for dual-port memory cell support.

While various embodiments of memory cells and memory devices in accordance with the principles disclosed herein have been described above, it should be understood that they have been presented by way of example only, and are not limiting. Thus, the breadth and scope of the invention(s) should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 CFR 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Brief Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A random access memory array circuit comprising:
 a first communication line and a second communication line;
 a memory cell disposed between the first and second communication lines and including a plurality of bit-elements;
 a first plurality of access devices, each coupled between a respective one of the plurality of bit-elements and the first communication line;

a second plurality of access devices, each coupled between a respective one of the plurality of bit-elements and the second communication line; and
an address line coupled to at least two corresponding sets of the first and second pluralities of access devices for controlling concurrent communication between the bit-elements disposed between the sets and the first and second communication lines.

2. A circuit according to claim 1, wherein the bit-elements include bistable latches.

3. A circuit according to claim 1, wherein the access devices include pass transistors.

4. A circuit according to claim 3, wherein the address line is in communication with a control line of the each of the pass transistors.

5. A circuit according to claim 1, wherein each bit-element has a true node and a complementary node, wherein the plurality of access devices includes, for each bit-element, an access device coupled between the true node of the bit-element and the first communication line, and wherein the plurality of access devices further includes, for each bit-element, an access device coupled between the complementary node of the bit-element and the second communication line.

6. A circuit according to claim 1, further comprising:
a second address line coupled to other corresponding sets of the first and second pluralities of access devices for controlling communication between the bit-elements disposed between the other sets and the first and second communication lines, wherein the first and second address lines are directly electrically coupled.

7. A static random access memory device comprising:
a first bit-element;
a second bit-element;
first and second bit lines connected to the first and second bit-elements;
a first set of access devices for respectively controlling communication between the first and second bit lines and the first bit-element;
a second set of access devices for respectively controlling communication between the first and second bit lines and the second bit-element; and
at least one word line for concurrently activating the first and second sets of access devices.

8. A device according to claim 7, wherein each bit-element includes a bistable latch.

9. A device according to claim 7, wherein each bit-element includes a plurality of inverters.

10. A device according to claim 7, wherein the at least one word line is a single word line connected to the first and second sets of access devices.

11. A device according to claim 7, wherein the at least one word line includes a first word line connected to the first set of access devices and a second word line connected to the second set of access devices.

12. A device according to claim 11, wherein the first and second word lines are directly connected by a conductive line.

13. A device according to claim 11, further comprising a row selector for simultaneously activating the first and second word lines.

14. A random access memory array circuit comprising:
a memory cell including a plurality of bit-elements, each bit-element including a bistable latch having a first inverter and a second inverter, wherein an input terminal of the first inverter is coupled to an output terminal of the second inverter at a true node, and wherein an input terminal of the second inverter is coupled to an output terminal of the first inverter at a complementary node;
a plurality of first pass transistors, each coupled between a first bit line and the true node of a respective one of the plurality of bit-elements;
a plurality of second pass transistors, each coupled between a second bit line and the complementary node of a respective one of the plurality of bit-elements;
a word line connected to control terminals of each of the first and second pass transistors for simultaneously controlling communication between the plurality of bit-elements and the first and second bit lines;
a plurality of third pass transistors, each coupled between a third bit line and the true node of a respective one of the plurality of bit-elements;
a plurality of fourth pass transistors, each coupled between a fourth bit line and the complementary node of a respective one of the plurality of bit-elements; and
a second word line connected to control terminals of each of the third and fourth pass transistors for simultaneously controlling communication between the plurality of bit-elements and the third and fourth bit lines.

15. A circuit according to claim 14, wherein the first and second word lines are directly connected by a conductive line.

16. A random access memory array circuit comprising:
first and second communication lines;
a first bit-element
a second bit-element;
a first set of access devices respectively coupled between the first bit-element and the first and second communication lines;
a second set of access devices respectively coupled between the second bit-element and the first and second communication lines;
an address line coupled to the first set of access devices for respectively controlling communication between the first bit-element and the first and second communication lines; and
a selectable connection for coupling the address line to the second set of access devices for respectively controlling communication between the second bit-element and the first and second communication lines.

17. A circuit according to claim 16, wherein the selectable connection is selectable by a metal mask option.

18. A circuit according to claim 16, wherein the selectable connection is selectable by a polysilicon mask option.

19. A circuit according to claim 16, wherein the selectable connection is selectable by a fuse.

20. A static random access memory device comprising:
a memory array having a plurality of memory cells arranged in a matrix of rows and columns;
a plurality of word lines for activating respective rows of memory cells, each of said memory cells disposed between first and second communication lines and comprising:
a bit-element,
a first access device coupled between the bit-element and the first communication line,
a second access device coupled between the bit-element and the second communication line; and
a word line coupled to the first and second access devices for controlling concurrent communication between the bit-element and the first and second communication lines;

an address decoder for receiving address data via a plurality of address data lines and activating the word line according to the received address data; and a selectable connection for coupling at least two of the address data lines.

21. A device according to claim 20, wherein the selectable connection is selectable by a metal mask option.

22. A device according to claim 20, wherein the selectable connection is selectable by a polysilicon mask option.

23. A device according to claim 20, wherein the selectable connection is selectable by a fuse.

* * * * *